United States Patent [19]
Wettling et al.

[11] Patent Number: 6,147,297
[45] Date of Patent: *Nov. 14, 2000

[54] SOLAR CELL HAVING AN EMITTER PROVIDED WITH A SURFACE TEXTURE AND A PROCESS FOR THE FABRICATION THEREOF

[75] Inventors: Wolfram Wettling; Stefan Glunz, both of Freiburg, Germany

[73] Assignee: Fraunhofer Gesellschaft zur Foerderung der angewandten Forschung e.V., Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/981,444
[22] PCT Filed: Jun. 19, 1996
[86] PCT No.: PCT/DE96/01082
  § 371 Date: Mar. 11, 1998
  § 102(e) Date: Mar. 11, 1998
[87] PCT Pub. No.: WO97/01189
  PCT Pub. Date: Jan. 9, 1997

[30] Foreign Application Priority Data

Jun. 21, 1995 [DE] Germany .............. 195 22 539

[51] Int. Cl.$^7$ ...................... H01L 31/0236; H01L 21/302
[52] U.S. Cl. ............................................. 136/256; 438/71
[58] Field of Search .................. 136/255, 256, 136/249; 438/39, 40, 41, 42, 43, 44, 71; 216/41

[56] References Cited

U.S. PATENT DOCUMENTS

| | | | |
|---|---|---|---|
| 3,460,240 | 8/1969 | Tarneja et al. | 29/572 |
| 3,985,579 | 10/1976 | Rahilly | 136/89 |
| 4,029,518 | 6/1977 | Matsutani et al. | 136/89 |
| 4,152,824 | 5/1979 | Gonsiorawski | 29/572 |
| 4,314,231 | 2/1982 | Walty | 338/328 |
| 4,322,571 | 3/1982 | Stanbery . | |
| 4,343,962 | 8/1982 | Neugroschel et al. | 136/255 |
| 4,367,368 | 1/1983 | Wolf | 136/255 |
| 4,665,277 | 5/1987 | Sah et al. | 136/255 |
| 4,916,503 | 4/1990 | Uematsu et al. | 357/30 |
| 5,215,599 | 6/1993 | Hingorani et al. | 136/255 |
| 5,217,539 | 6/1993 | Fraas et al. | 136/246 |
| 5,431,741 | 7/1995 | Sakaguchi et al. | 136/244 |
| 5,494,832 | 2/1996 | Lehmann et al. | 437/2 |
| 5,580,395 | 12/1996 | Yoshioka et al. | 136/255 |
| 5,591,565 | 1/1997 | Holdermann et al. | 430/314 |
| 5,704,992 | 1/1998 | Willeke et al. | 136/255 |
| 5,726,065 | 3/1998 | Szlufcik et al. | 437/2 |

OTHER PUBLICATIONS

1990 IEEE "Deeply–Grooved Silicon Concentrator Solar Cells for Use with Prismatic Covers", J.S. Culik, E.L. Jackson and A.M. Barnett, May 21, 1990, pp. 251–256.
1993 IEEE "High–Efficiency Solar Cells from FZ, CZ and MC Silicon Material", J. Knobloch et al, May 10, 1993, pp. 271–276.
Applied Physics Letters (1990) No. 6, New York, US—"24% efficient silicon solar cells", pp. 602–604.
Wang et al., "24% efficient silicon solar cells," Applied Physics Letters, vol. 57, No. 6, pp. 602–604, Aug. 1990.
Knobloch et al., "High–Efficiency Solar Cells from FZ, CZ and MC Silicon Material," Proceedings of The Photovoltaic Specialists Conference, 23rd conference, pp. 271–276, May 10, 1993.

*Primary Examiner*—Nam Nguyen
*Assistant Examiner*—Michael C. Miggins
*Attorney, Agent, or Firm*—Evenson, McKeown, Edwards & Lenahan, P.L.L.C.

[57] ABSTRACT

Disclosed is a process for fabricating a solar cell as well as the solar cell itself having a grid-shaped surface texture provided with a n-doped emitter layer provided on a base material.

The invention is distinguished by the fact that the base material is first covered full-surface with a $n^{++}$ doping layer in the course of diffusion doping followed by a selective etching procedure on the emitter layer using a mask which produces the surface texture in such a manner that a multiplicity of crisscrossing rows of pointed ribs is created whose top section is composed of the $n^{++}$ doped doping layer and bottom section of the base material.

25 Claims, 5 Drawing Sheets

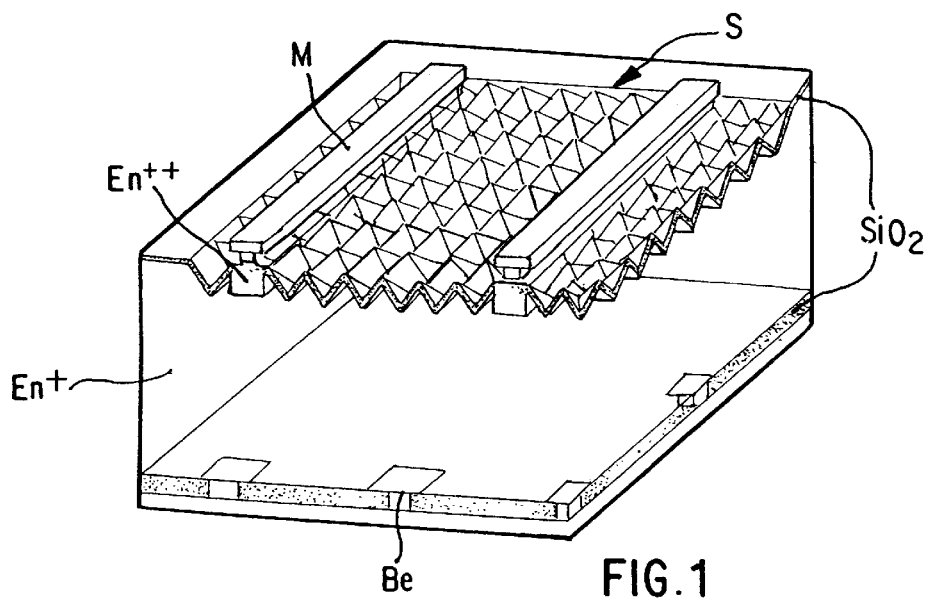
FIG.1
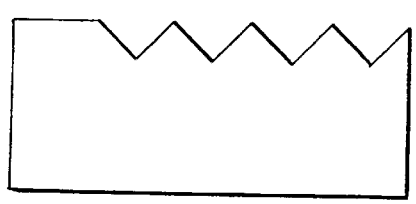
FIG. 2a(1)
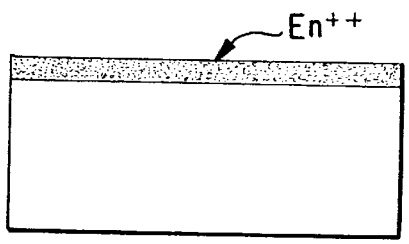
FIG. 2b(1)
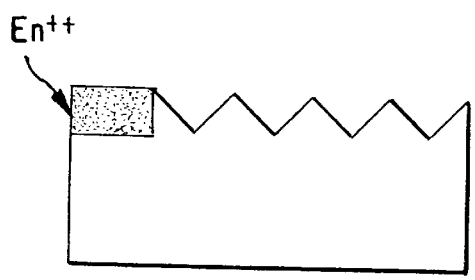
FIG. 2a(2)
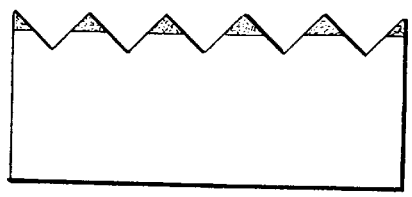
FIG. 2b(2)
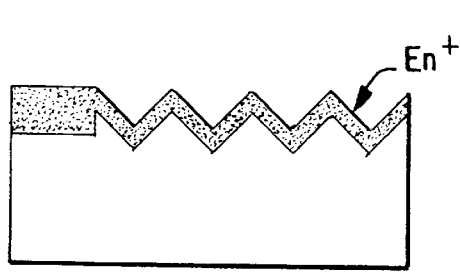
FIG. 2a(3)
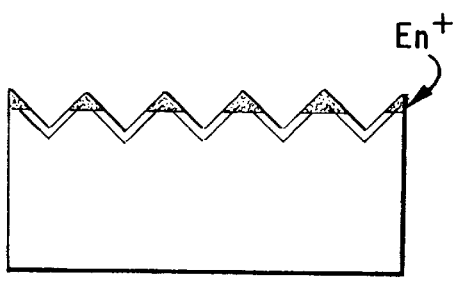
FIG. 2b(3)

SOLAR CELL HAVING AN EMITTER PROVIDED WITH A SURFACE TEXTURE AND A PROCESS FOR THE FABRICATION THEREOF

BACKGROUND AND SUMMARY OF THE INVENTION

This application claims the priority of German patent document 195 22 539.2, the disclosure of which is expressly incorporated by reference herein.

1. Field of the Invention

The present invention relates to a solar cell having an emitter layer disposed on a base material, and a surface texture distinguished by rows of crisscrossing pointed ribs, and to a process for the fabrication of such a solar cell.

2. Background of the Related Art

Solar cells are components which convert sunlight or other light into electric energy. A solar cell usually comprises a semiconductor material, which is provided with a p-n junction. In the semiconductor, incident light generates positive-charged and negative-charged carriers which are separated by the p-n junction. The electric power generated in this matter is tapped via metal contacts on the n- and p-sides.

From the many known embodiments of solar cells, the subject matter of the present invention is confined to solar cells with a high degree of efficiency of >20%. These electric components, also called "high-efficiency" solar cells, are preferably made of silicon. "High-efficiency" solar cells are distinguished, in particular, by the fact that losses due to the conversion of light into electricity are minimal. This is made possible by a number of measures, described in detail, for instance, by M. A. Green, "High-efficiency Silicon Solar Cells", TransTech Publications, Aedermannsdorf, Switzerland (1987).

The solar cell with the hitherto highest attainable efficiency is the so-called PERL ("Passivated emitter and rear, locally diffused") solar cell described, for example in Appl. Phys. Lett. 57(6), Jun. 8, 1990, pp. 602–604. The construction of [the, as] such known, "high performance solar cell" can be seen in FIG. 1. The PERL cell is provided with a textured surface S, which is coated with a layer of silicon dioxide $S1O_2$, due to its electric passivation and antireflex effect. Under the silicon dioxide layer is an emitter layer E, which is provided with regions of high $n^{++}$ doping and of normal $n^+$ doping. The emitter layer is formed in a three-dimensional configuration by selective etching in such a manner that the contour of its surface corresponds to the impression of many adjacently disposed square pyramids. The emitter layer is provided deeper and with higher doping only at sites where the emitter layer comes into contact with a metal contact strip M.

Due to the typical design of the characteristic surface texture of the emitter layer, on the one hand, the light penetrating through the emitter layer into the solar cell enters the cell with less losses and, on the other hand it cannot so easily leave the interior of the solar cell again. In addition to the antireflex effect of the top silicon dioxide layer, this layer also contributes to the electric passivation of the surface.

An essential aspect of this textured surface of the PERL cell is the two-step n-doping of the emitter, which in the area under the contacts of the metal bridges is high doped (and therefore low-ohmic) and is deeper than in the areas under the "inverted pyramids", where the emitter layer is doped weaker and runs flatter. (For the sake of completeness, it is noted that base contact electrodes BE are provided on the rear side of the solar cell facing the emitter layer.)

Two photomasking steps are required for the fabrication of PERL solar cells: an etching step to produce the riblike surface texture and a local diffusion step for placing the deep $n^{++}$ diffusion areas at sites over which the metal contact bridges are disposed. In a third process step, the surface contour of the solar cell is coated with a full-surface $n^+$ diffusion layer.

Despite its previously unattainable degree of efficiency, the two previously mentioned masking steps make fabrication of the PERL solar cell complicated and expensive.

Furthermore, the elongated metal contact bridges reduce the effective solar cell surface which absorbs light energy, thereby limiting its efficiency.

One object of the present invention is to provide an improved construction of a so-called PERL solar cell, which on the one hand, simplifies its fabrication and, on the other hand, further enhances its degree of efficiency.

Another object of the invention is to minimize the portion of surface of the solar cell which is covered by contacting elements, and therefore cannot contribute to the conversion of light.

These and other objects and advantages are achieved by the solar cell and fabrication process according to the invention, in which the solar cell has a grid-shaped surface texture provided with an n-doped emitter layer formed on a base material. In a first step of the fabrication process, a full-surface high-doped $n^{++}$ doping layer is produced in a to-be-processed base material. Preferably, this $n^{++}$ doping layer is placed in the top region of the base material by diffusion of the dopants. A subsequent selective etching process textures the $n^{++}$ doping layer using an etching mask on its surface, so as to create a multiplicity of intersecting rows of ribs having a pointed cross section, and whose top sections are composed of the $n^{++}$ doped doping layer and their respective bottom parts of the base material (see FIG. 2).

In this manner, it is achieved that the top edges of the rows of ribs are composed of high-doped material. Thus in an overall view of all the crisscrossing rib edges on the top side of emitter layer, a low-ohmic grid covering the entire cell surface is formed on the top side of the emitter layer.

A particular advantage of the grid-emitter structure according to the invention, (also referred to herein as a "GE" structure) is that by placing, a fine contact wire grid on the GE structure, electric contacting of the emitter of the solar cell can be accomplished, thereby reducing to a minimum the shading effect caused by the filigree design of the contact grid. Moreover, the invented process also obviates the second, expensive photomasking step required in the conventional process, thereby lowering fabrication costs.

In order to create the parts of the surface which lie between the high-doped top edges of the ribs and are able to contribute to converting electromagnetic radiation into electric energy due to the etching procedure down to the base material, the entire surface texture of the invented solar cell can be doped with $n^+$ dopants. In this manner, a two-step doped emitter is obtained, which is provided with regions of highest doping only under the top edges of the rows of ribs with the doping diminishing with rib depth. This two-step manner of doping favorably influences recombination in the emitter.

By selecting different mask configurations for the etching process it is possible to control the configuration of the rib rows. Furthermore, the invented process permits fabricating a solar cell whose one surface is provided with both emitter and base connections.

According to the present invention, the following steps are used to fabricate a solar cell of this type:

First, the whole surface of a base material is doped with $p^+$ dopants, preferably by diffusion doping. Subsequently, the surface predoped in this manner is doped once more with $n^{++}$ dopants. The doping profile is selected such that the n-dopants penetrate less deeply into the base material than the p-dopants. To produce a desired surface texture, an etching mask is employed in a subsequent selective etching process in order to obtain a multiplicity of intersecting rows of pointed ribs. The etching mask configuration is selected so that the rows of ribs in the peripheral surface region are higher than the internal rows of ribs enclosed by the peripheral rows; thus, the top section of the higher rows of ribs are composed of the $n^{++}$ doped doping layer and the top sections of the internal rows of ribs are composed of $p^+$-doped doping layer.

The invented process also makes it possible to obtain regions of varying doping characteristics on one and the same surface which, moreover, differ from each other with regard to their relative level. Thus, the emitter level which is composed of the top edges of the higher rows of ribs project above the base level which is composed of the top edges of the lower rows of ribs. As the following descriptions accompanying the figures show, the height of the individual rows of ribs can be varied by a suitable selection of the masks employed during the etching procedure.

Compared to the known PERL solar cell, the invented improvement is provided with rows of ribs whose top pointed region is doped $n^{++}$ and bottom region is composed of the base material.

Other objects, advantages and novel features of the present invention will become apparent from the following detailed description of the invention when considered in conjunction with the accompanying drawings.

BRIEF DESCRIPTION OF THE DRAWINGS

FIG. 1 a schematic, perspective representation of a known PERL solar cell;

FIGS. 2a(1)–(3) and 2b(1)–(3) are schematic diagrams which illustrate the fabrication of the emitter of a PERL solar cell and a grid-emitter solar cell according to the invention;

DESCRIPTION OF THE PREFERRED EMBODIMENTS

FIG. 2 shows a comparison of emitter fabrication processes for the known PERL solar cell (FIG. 2a) and for the solar cell according to the invention (FIG. 2b). In the known PERL process (FIG. 2a), the surface of the base material is textured in a first step (1) with the aid of a suitable mask. This is followed by the production of a high-doped $n^{++}$ region $En^{++}$ reaching deep into the base material in the second step (2), using a corresponding second mask, by means of local diffusion. This structure which later serves as the contact region to an external electrode contact. Thereupon, in a subsequent step (3) the entire textured surface is doped $n^+$ ($En^+$).

In contrast to the above-described process, in order to produce the GE structure according to the present invention, as shown in FIG. 2b, the entire surface of the top side of the base material is doped $n^{++}$ in a first step (1). This is followed by an etching step, employing a suitable mask to produce the structuring shown in step (2) of FIG. 2. It is essential that the etching depth between the individual rows of ribs reaches into the base material in such a manner that high-doped $n^{++}$ regions remain under the pointed edges of each individual row of ribs. With the obviation of the need for a second masking step, in addition, full-surface doping can ensue, this time with $n^+$ dopants, yielding in this manner a novel emitter structure in which the emitter region lies under the edges of the respective rows of ribs. In this manner, a low-ohmic grid is created which covers the entire surface of the cell, as shown by way of illustration in FIG. 3. The uniqueness of the GE structure is that the texturing can be utilized not only for the optical adaptation of the cell but also for structuring the emitter and the contacts. In this manner, compared to conventional structuring, a time-consuming and expensive photomasking step can be obviated.

Figure 3A:
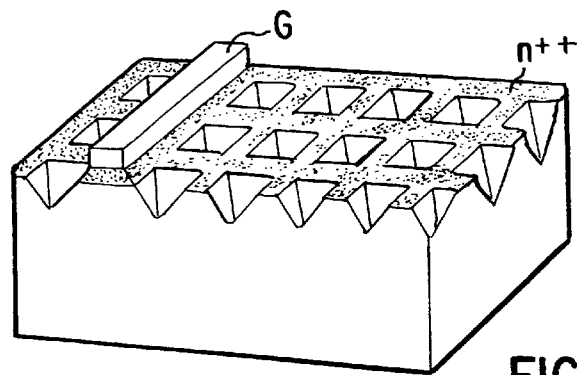
FIGS. 3a, b are perspective representations of the invented grid-emitter structure, respectively, without and with additional homogenous $n^+$ doping.
Figure 3B:
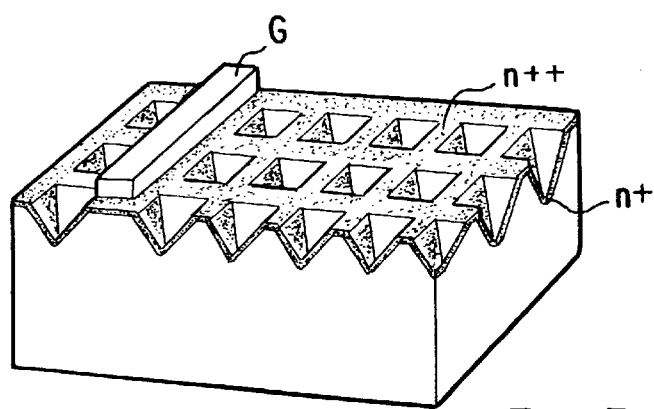

The representations according to FIG. 3 show in the perspective representation the invented GE structure without (FIG. 3a) and with (FIG. 3b) additional homogenous n+doping (see 3b).

For contacting the emitter layer, as shown in FIG. 3, an electric contact G is disposed on top of the edges in such a manner that an electric contact is produced which is as low-ohmic as possible. The electrode G is preferably part of an electrode grid, as described hereinafter with respect to FIGS. 7 and 8, which only minimally masks the effective solar cell surface.

Figure 4A:
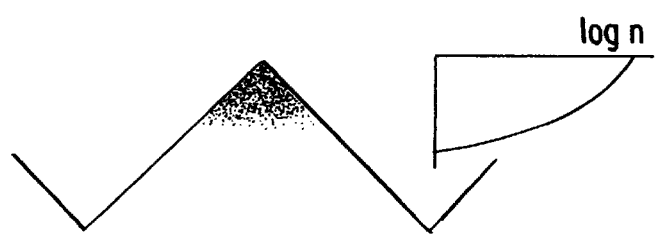
FIGS. 4a, b show diffusion profiles below the edges of the rows of ribs, with simple emitter diffusion and with double emitter diffusion, respectively.
Figure 4B:
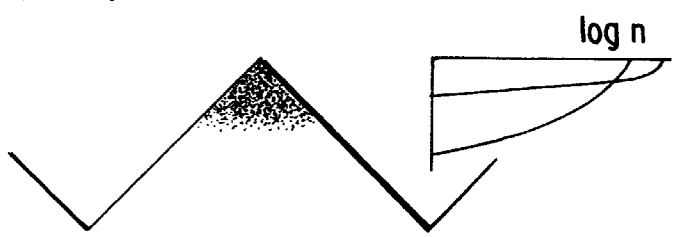

FIG. 4 shows possible doping profiles which have in common the production of a high concentration of dopant in the region of the edges of the respective rows of ribs, with the doping diminishing with increasing edge depth. This doping profile has a favorable influence on the recombination possibilities within the emitter. Therefore, the conductivity in the edge can be further improved by a double diffusion profile according to the representation of FIG. 4b.

Figure 5A:
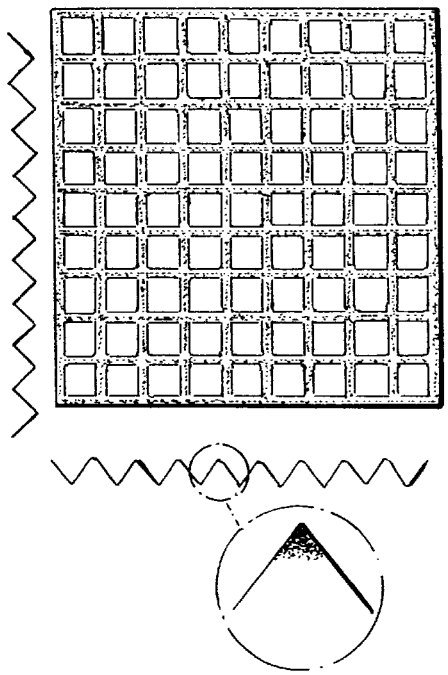
FIGS. 5a, b, c, d show various etching masks for producing the invented surface texture.

As previously mentioned with regard to the individual nature of the surface texture, the size and shape of the intersecting rows of ribs can be determined by the selection of suited etching masks. The use of a grid-shaped mask with square mesh fields according to FIG. 5a permits creation of a relief corresponding to the impression of many adjacently disposed, square inverse pyramids on the surface of the to-be-processed solar cell during the etching process. The spacing of the individual inverse pyramids in relation to each other is determined by the width of the intermediate strips of the grid mask, which in the present case is the same in every direction.

Figure 5B:
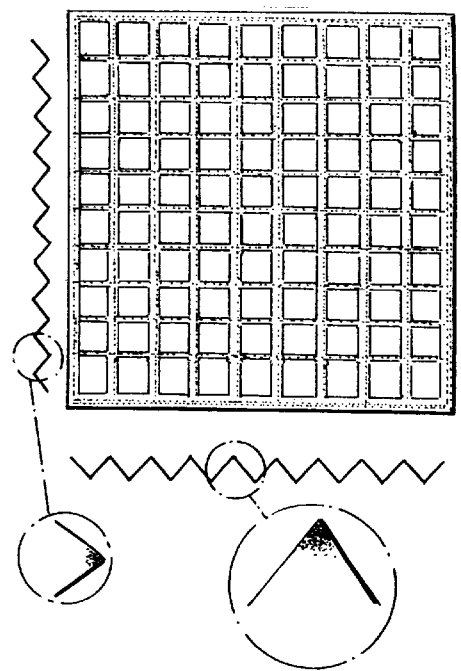

The mask according to FIG. 5b also is provided with square mesh fields; however the intermediate strips which intersect vertically, are of different widths. Due to the narrower intermediate strips running horizontally, the masking effect during the etching procedure is smaller. Therefore, more material can be removed in the direction of the narrow intermediate strips than in the orthogonal direction along the wider intermediate strips.

The representations of FIG. 5 depict the respective lateral cross section of the mask grid, showing the etching profile in the respective direction of the solar cell to be processed. Therefore, using the etching masks according to FIG. 5b, lower rows of ribs develop in vertical direction than in horizontal direction. As a consequence, there is higher conductivity in the ribs in vertical direction than in horizontal direction.

Figure 5C:
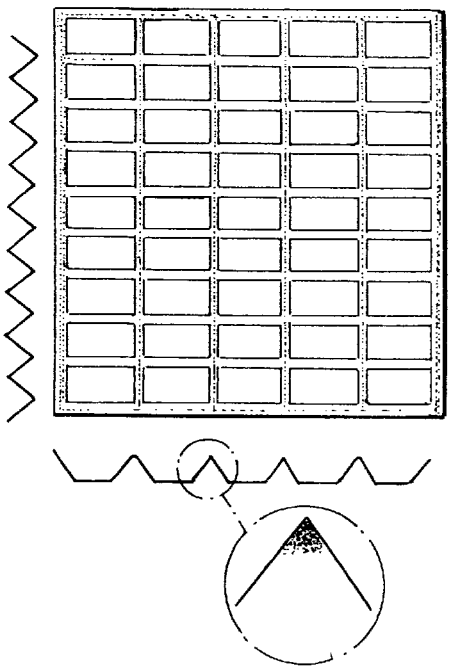

The mesh fields of the etching mask may, according to FIG. 5c also be given an oblong shape in the event that the emitter surface and the emitter resistance are to be larger in one direction than in the other. Thus large grooves are yielded between the individual rows of ribs as the course of the horizontal profile in FIG. 5c shows. In this manner, different conductivity, determined by the relationship of the lengths of the sides to each other, can be developed within the emitter structure in vertical and horizontal direction.

In addition to the influence of the width of the intermediate strips of an etching mask on the height of the developing rows of ribs, influence can also be exerted on the GE diffusion profile. Thus, by way of illustration, using the mask according to FIG. 5b, a higher doped profile is yielded in the horizontal row than in the vertical row. The reason for this is that removal by etching in the vertical row is greater.

Figure 5D:
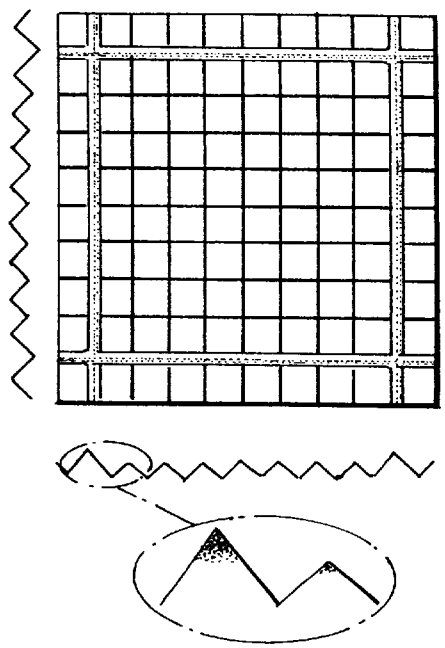

A suited configuration of wide and narrow strips according to FIG. 5d permits producing so-called super-grid structures as the cross section profiles in both directions show. Thus, wide intermediate strips enclosing a square area crisscrossed only by narrow intermediate strips are provided in the peripheral region of the solar cell surface. In this manner, in the peripheral region, high rows of ribs are retained which enclose lower rows of ribs in the internal region of the solar cell.

With the aid of the aforementioned etching grid variants, (without limiting possible mask configurations), grid-emitter structures can be produced which can for the most part assume any grid configuration. A special advantage of the invented GE structure is the high doping at the top regions of the developing rows of ribs with raised cross-conductivity being created which ultimately leads to a reduction of the electrode contact areas coming into contact with the grid structure. Thus for contacting, a few so-called grid fingers representing a single electric contact area can be employed, which reduces masking losses and the technology can be considerably simplified.

By reducing the electrode contact areas, the invented GE structure is also suited for use of so-called serigraphed contact sites.

Figure 6A:
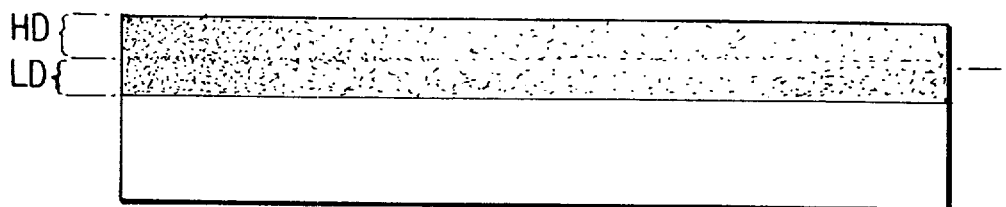
FIGS. 6a–e illustrate process steps for fabricating a grid-emitter solar cell with electroplated (galvanic) contacts.
Figure 6B:

As previously mentioned, the doping profiles can be selectively set in the developing rows of ribs by deeper etching. Thus, a high-doped "supergrid", as described for fabrication in FIG. 5d, can be produced in a low-doped GE structure. For this purpose, according to 6a, the base material is doped by double emitter diffusion yielding two doping profiles, a high-doped region HD and a low-doped region LD. Using, by way of illustration, an etching mask according to 5d yields after the etching procedure the emitter structure according to FIG. 6b. Essentially it is to be noted that the top part of the high rows of ribs is provided with regions of high doping, whereas the lower rows of ribs are provided at the top edges solely with regions of low doping.

Figure 6C:
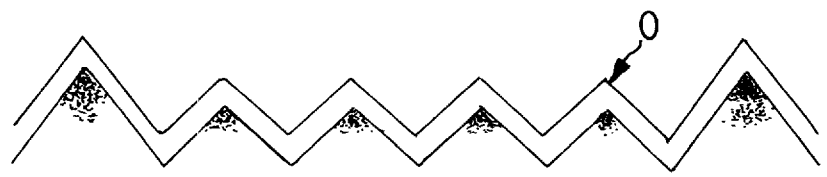
Figure 6D:
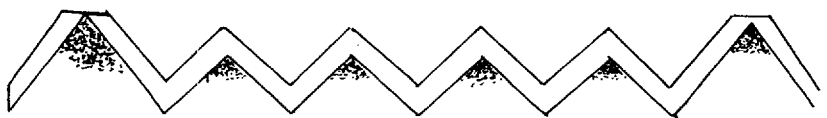
Figure 6E:
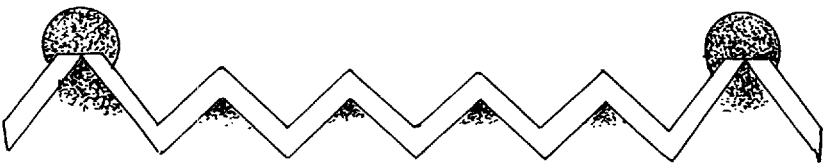

For mechanical protection and for diminishing reflex, an oxide layer O is preferably applied full-surface over the produced surface texture (according to FIG. 6c) and is removed locally until the edge region of the high-doped regions is exposed only at sites of the high rows of ribs (see FIG. 6d). For the production of electroplated contacts, electroplated contact elements are disposed according to FIG. 6e at these sites, producing in this manner a GE solar cell structure which can be optimized for highest efficiency by very fine contacts.

Figure 7:
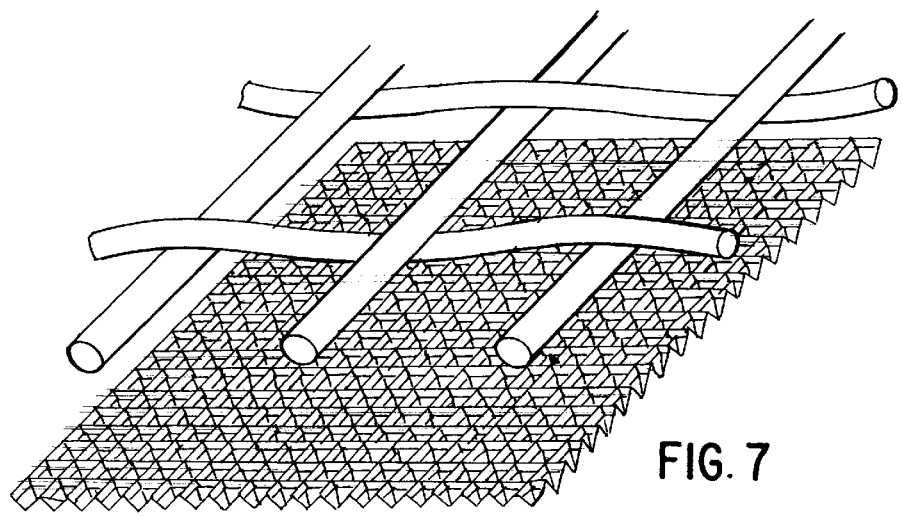
FIGS. 7, 8 show a wiremesh-grid-emitter solar cell.
Figure 8:
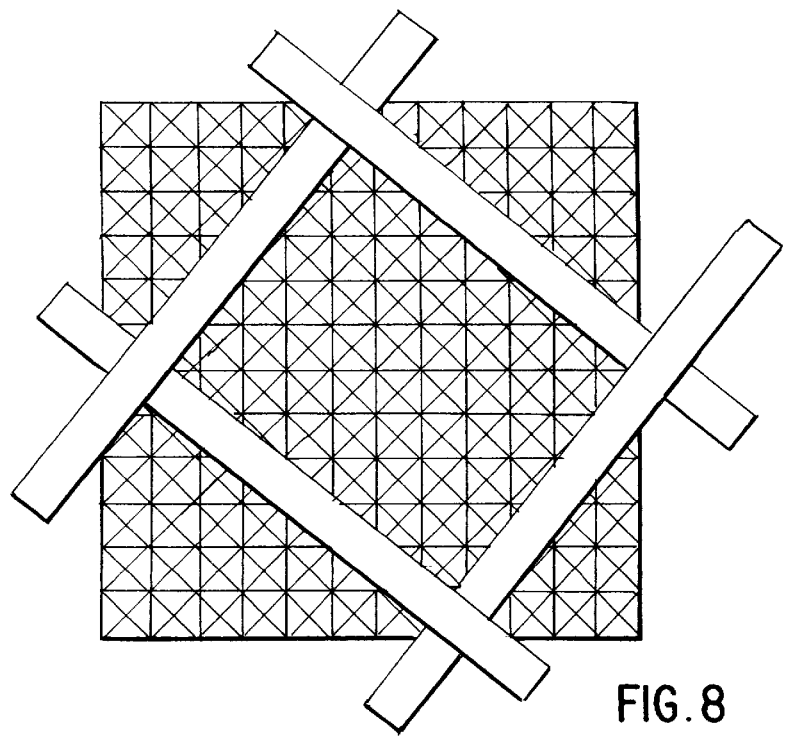

An alternative preferred technique for placing electric contact sites on the surface of the GE structure is, as previously mentioned, the use of extremely fine wire mesh according to FIG. 7. The wire mesh is preferably placed on the edges of the rows of ribs by pressing the wire, if need be under the influence of heat, ultrasound or a flow medium. An advantage is that the wire mesh, with dimension of 20 $\mu$m wire diameter and 2000 $\mu$m mesh width, does not need to be adjusted to the GE structure, but rather according to FIG. 8 can take up any arbitrary position relative to the direction of the rows of ribs. This type of electric contacting is therefore especially suited for automated production.

The previous techniques for producing so-called GE structures can also be transferred analogously to base contacting. Thus the base side of the solar cell facing the emitter side should be processed in the same manner, only with correspondingly inverted doping concentrations. For this purpose, the n-dopants have to be replaced by p-dopants. In this manner, a so-called high-doped BSF (back surface field) grid (GBSF) can be created, which can be employed instead of point contacting as shown in FIG. 1. The entire back side can therefore either be vaporized with aluminum over an oxide or be provided with only a few electric contact sites as the emitter side. In the latter case, a so-called bifacial solar cell, i.e. a solar cell which can be illuminated from both sides is yielded.

Of course, a solar cell with a GE or with a GBSF structure can be processed.

Figure 9:
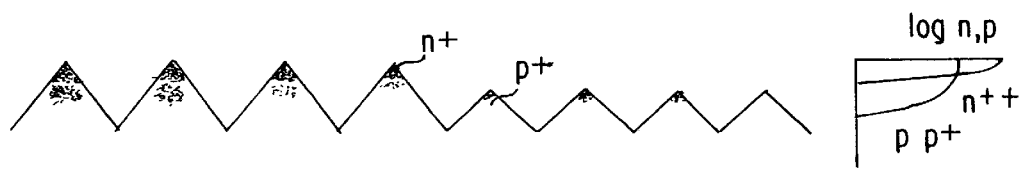
FIG. 9 shows a grid-emitter structure with base and emitter contacts on one surface side of the solar cell.

Finally, the FIG. 9 shows a further novel variant of a surface textured solar cell provided with both the emitter contacts and the base contacts on a single surface. This structure is obtained in that in a first step the base material is doped with $p^+$ dopants and subsequently a $n^{++}$ doping layer is diffused in. Using a suited etching mask for producing "supergrid emitters" (see FIG. 5d) a structure, as described in FIG. 9 in cross section, can be processed so that the deeper etched edges of the rows of ribs are provided with the $p^+$ doping layer and the higher etched ones the $n^{++}$ doping layer.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A process for fabricating a solar cell having an n-doped emitter layer provided with a grid-shaped surface texture formed on a base material, said process comprising the acts of:

forming a full-surface $n^{++}$ doped emitter layer on a top surface of said base material; and selectively etching said full-surface emitter layer using a grid mask to produce the surface texture in such a manner that a multiplicity of intersecting rows of pointed ribs are created, whose top section is composed of said $n^{++}$ doped doping layer and whose bottom part is composed of said base material.

2. The process according to claim 1, wherein the surface textured by the etching procedure also includes $n^+$-doped full-surface layer.

3. The process according to claim 2, wherein the $n^{++}$ doped layer is provided deeper than the $n^+$ doping layer.

4. The process according to claim 1, wherein the surface texture correspond to the impression of adjacently disposed inverse square pyramids.

5. The process according to claim 1, wherein the $n^{++}$ doping layer is approximately 3 $\mu$m deep.

6. The process according to claim 1, wherein the $n^+$ and $n^{++}$ dopings are performed by a dopant diffusion process.

7. The process according to claim 1, wherein the mask corresponds to a grid having square or oblong mesh fields.

8. The process according to claim 7, wherein a remaining height of said rows of ribs is determined by a width of intermediate strips of the grid mask whereby an amount of material removed in the etching process is inversely proportioned to the width of the intermediate strips.

9. The process according to claim 1, comprising a further step in which a contact electrode array is disposed on the rows of pointed ribs.

10. A process according to claim 9, wherein said contact electrode array is a wire mesh which is placed on the rows of pointed ribs by pressing on it.

11. The process according to claim 10, wherein said wire mesh has a mesh width of substantially 2000 $\mu$m and wire thereof has a cross section of substantially 20 $\mu$m.

12. The process according to claim 1, wherein masks provided with a grid-shape are employed which possess different sized mesh fields and different width intermediate strips and which determine the distance between said ribs as well as influence a height of the rows of the ribs and a degree of doping thereof.

13. A process according to claim 12, wherein:
an oxide layer is precipitated onto the entire surface and said oxide layer is removed locally down to a top commencement of said $n^{++}$ doping layer only at elevated rib sites; and
electroplated galvanic contacts are disposed on $n^{++}$-doped free sites.

14. The process according to claim 1, wherein a back side of said solar cell facing said textured emitter layer is processed in the same manner as said emitter layer, using p-dopings for the base contacts instead of n-dopings.

15. A process for fabricating a solar cell having a surface layer provided with a grid-shaped surface texture and with n- and p-doped regions, which are provided on a base material, said process comprising:
forming a full-surface $p^+$ doped base layer on a top surface of the base material;
forming a full-surface $n^{++}$ doped emitter layer in the top surface of the base material, said $n^{++}$ doped emitter layer however being thinner than said $p^+$ doping base layer; and selectively etching said doped layers using a grid mask producing said surface texture in such a manner that a multiplicity of rows of pointed ribs is created, wherein at certain intervals, rows of ribs are higher than other rows of ribs, and wherein top sections of higher rows of ribs are composed of said $n^{++}$ doped doping layer and top sections of said lower rows of ribs are composed of said $p^+$ doped layer.

16. A solar cell comprising:
an emitter layer disposed on a base material, said emitter layer including a surface texture with intersecting rows of pointed ribs which form inverted pyramids wherein an area surrounding each of the inverted pyramids at a top surface is $n^{++}$ doped and wherein a second area at a bottom surface of said inverted pyramids is composed of said base material.

17. The solar cell according to claim 16, wherein rows of ribs form top peak edges with a low-ohmic grid covering an entire surface of the solar cell.

18. The solar cell according to claim 16, wherein concentration of the dopant diminishes from said top edge of each row of ribs to said base material.

19. The solar cell according to claim 16, wherein peripheral rows of ribs disposed on a peripheral surface region of the solar cell are higher than enclosed rows of ribs enclosed by higher ribs.

20. The solar cell according to claim 19, wherein peaks of said peripheral rows of ribs are doped stronger than enclosed rows of ribs.

21. The solar cell according to claim 16, further comprising:
an oxide layer over enclosed rows of ribs; and
electroplated contacts at edges of peripheral rows of ribs.

22. The solar cell according to claim 16, further comprising a contact grid, which is disposed arbitrarily on said rows of ribs.

23. The solar cell according to claim 16, wherein a contact side of said base material facing said emitter layer includes $p^+$ doped regions.

24. The solar cell according to claim 23, further comprising one of an aluminum layer and individual contact electrodes for electrically contacting a bottom side of said base material.

25. The solar cell according to claim 16, further comprising $p^+$ doped rows of ribs on a top side of the emitter layer which are lower in height when compared to the $n^{++}$ doped rows of ribs.

* * * * *